(12) United States Patent
Keib

(10) Patent No.: US 7,748,987 B2
(45) Date of Patent: Jul. 6, 2010

(54) METHOD AND APPARATUS FOR PERFORMING TURNAROUND TESTING ON A DIGITAL SIGNAL 1 BOARD

(75) Inventor: David Keib, Joliet, IL (US)

(73) Assignee: Aspect Software, Inc., Lombard, IL (US)

( * ) Notice: Subject to any disclaimer, the term of this patent is extended or adjusted under 35 U.S.C. 154(b) by 76 days.

(21) Appl. No.: 11/769,186

(22) Filed: Jun. 27, 2007

(65) Prior Publication Data

US 2009/0003224 A1    Jan. 1, 2009

(51) Int. Cl.
H01R 29/00    (2006.01)
H02B 1/056    (2006.01)

(52) U.S. Cl. ........................................................ 439/54

(58) Field of Classification Search .................... 439/54, 439/367, 540.1, 701, 638, 157; 385/55, 56, 385/59, 76
See application file for complete search history.

(56) References Cited

U.S. PATENT DOCUMENTS

| | | | |
|---|---|---|---|
| 5,013,247 A * | 5/1991 | Watson | ........................ 439/55 |
| 5,060,226 A | 10/1991 | Gewin et al. | |
| 5,326,279 A * | 7/1994 | Sumida | .................... 439/540.1 |
| 5,600,656 A | 2/1997 | Kelsey et al. | |
| 5,892,756 A | 4/1999 | Murphy | |
| 6,343,950 B1 * | 2/2002 | Eginton et al. | ........... 439/540.1 |
| 6,467,055 B1 | 10/2002 | Katuszonek | |
| 6,767,241 B1 * | 7/2004 | Abel et al. | .................. 439/417 |
| 6,857,900 B2 * | 2/2005 | Kleeberger et al. | ....... 439/540.1 |
| 7,201,607 B2 * | 4/2007 | Bernhart et al. | ............. 439/532 |

* cited by examiner

*Primary Examiner*—Chandrika Prasad
(74) *Attorney, Agent, or Firm*—Husch Blackwell Sanders Welsh Katz

(57) ABSTRACT

A test adaptor for performing turnaround testing on a T1 board that has a plurality of jack receptacles disposed therein. The test adaptor is comprised of a bracket, a plurality of openings, and a plurality of test plugs. The bracket has a length and a width complimentary to the length and the width of an end of a T1 board. The plurality of openings disposed in the bracket are spaced apart from each other by predetermined distances that are complimentary to the spacing between the plurality of jack receptacles disposed in the T1 board. The plurality of test plugs are mounted within the plurality of openings in the bracket such that the plurality of test plugs can be engaged with the plurality of jack receptacles substantially simultaneously and with a single mechanical step.

19 Claims, 3 Drawing Sheets

METHOD AND APPARATUS FOR PERFORMING TURNAROUND TESTING ON A DIGITAL SIGNAL 1 BOARD

FIELD OF THE INVENTION

The invention pertains to communication systems and more particularly to the testing of T1 boards.

BACKGROUND OF THE INVENTION

T1 is a widely used standard in telecommunications in North America and Japan that transmits voice and data between devices. A T1 line is made up of twenty-four 8-bit channels and runs at a 1.544 Mbit/sec line rate. Furthermore, T1 lines use Time Division Multiplexing (TDM) to send signals over each channel of the T1 line.

It is known that T1 boards must be tested before being used commercially. To test a T1 board, users insert a test device (hereinafter referred to as a "turnaround plug") into each jack receptacle of the T1 board. One plug is used to test each jack receptacle, which carries a T1 line. During the testing process, an original signal is generated by software in the T1 board and is sent to a jack receptacle in the board. The jack receptacle sends the signal over a particular channel of the T1 line, which is, in turn, received by the turnaround plug. The turnaround plug returns a signal. If the original signal and the return signal are identical, then the T1 channel is functional. However, if the original signal and the return signal are different, then the user knows that there is a hardware problem in that particular T1 channel.

A standard T1 board contains five T1 lines per board, and up to seven T1 boards can be inserted into a chassis for testing. To test each T1 line, a turnaround plug must be inserted into each jack receptacle and then removed at the end of testing. Therefore, to test a chassis filled with seven T1 boards, with each board having five jack receptacles, thirty-five turnaround plugs must be inserted and removed. This process is tedious and time consuming.

T1 lines require physical connections so the channels of the T1 boards must be tested for continuity. Therefore, no true workaround to make the testing process easier and faster has been discovered. It would be preferable if there was a method of testing a T1 board that enhanced productivity and made the testing process easier and faster.

DETAILED DESCRIPTION OF THE EMBODIMENTS

Figure 1:
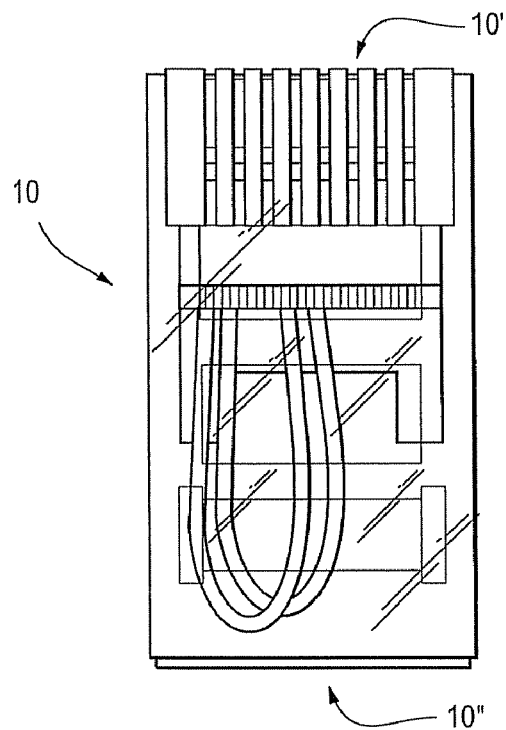
FIG. 1 is a top view of a test plug.

While embodiments of this invention can take many different forms, specific embodiments thereof are shown in the drawings and will be described herein in detail with the understanding that the present disclosure is to be considered as an exemplification of the principles of the invention and is not intended to limit the invention to the specific embodiment illustrated.

FIG. 1 is a top view of a test plug. As seen in FIG. 1, the test plug 10 has a first end 10' and a second end 10". In the present invention, an RJ45 turnaround plug can be used, for example. When testing a T1 board, it is preferable to use a turnaround plug 10 because turnaround plugs 10 help to diagnose hardware problems by receiving a signal and transmitting a return signal that is the same as the signal that was received. Using one turnaround plug 10 to test each T1 line in a T1 board allows for diagnosing and testing for hardware problems within each jack receptacle of the T1 board.

Figure 2:
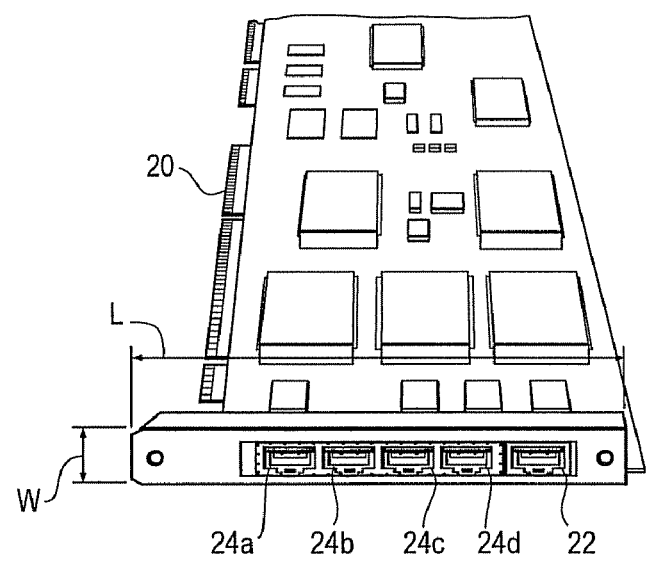
FIG. 2 is a perspective view of a T1 board with a plurality of jack receptacles.

FIG. 2 is a perspective view of a T1 board with a plurality of jack receptacles. As can be seen in FIG. 2, a T1 board 20 has an end with a length L and a width W. A plurality of jack receptacles 24a, 24b, 24c, 24d, 24e are disposed within the end 22 of the T1 board 20. As can be seen best in FIG. 4, the jack receptacles 24a, 24b, 24c, 24d, 24e are spaced apart from each other at predetermined distances 26a, 26b, 26c, 26d.

Figure 3:
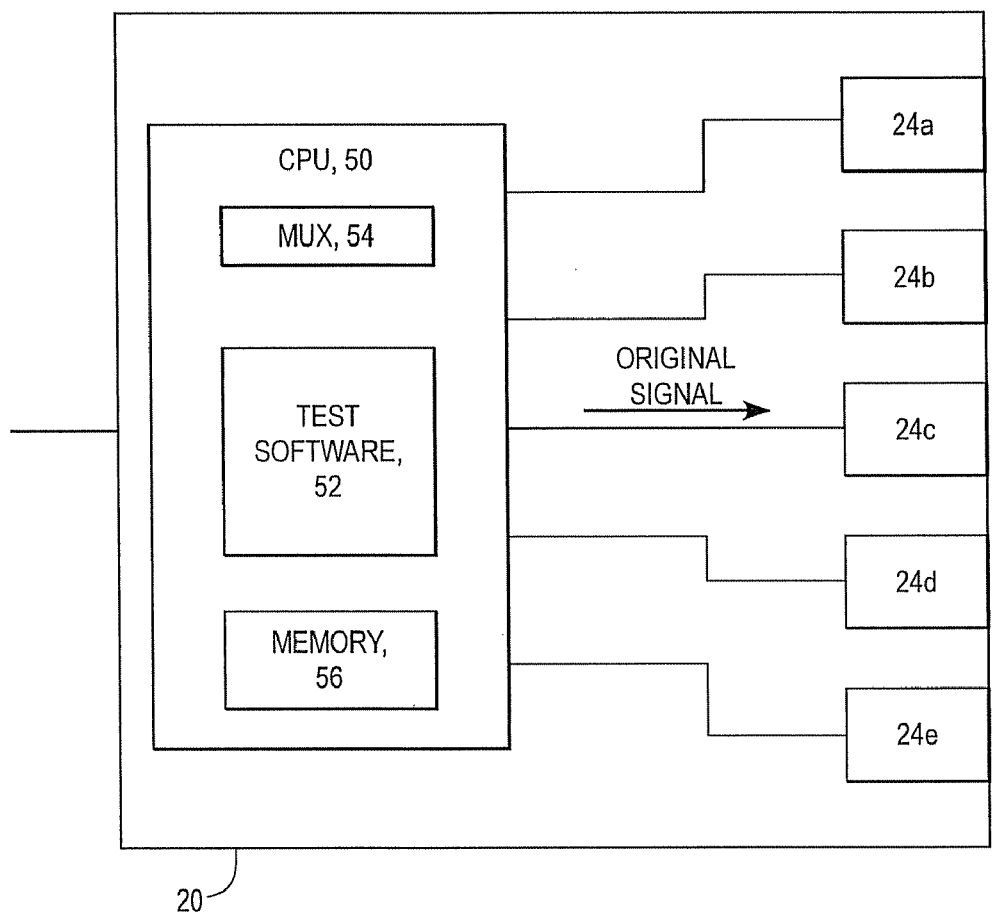
FIG. 3 is an operational block diagram of a T1 board.

FIG. 3 is an operational block diagram of a T1 board. In normal operation, a CPU 50 exchanges packet based signals with an external CPU (not shown) and couples those signals with respective channels of a T1 line through a multiplexer 54.

The CPU 50 located within the T1 board 20 also contains test software 52. The test software 52 generates pseudo-random signal patterns that are sequentially coupled to the respective channels of the T1 lines through jack receptacles 24a, 24b, 24c, 24d, 24e in the T1 board 20. The signal patterns generated by the test software 52 are hereinafter referred to as the original signals.

Each jack receptacle 24a, 24b, 24c, 24d, 24e is associated with a T1 line carrying twenty-four channels. Each of the twenty-four channels receives an original signal from the CPU 50. The original signal is sent from the jack receptacle 24n in the T1 board 20 to the test plug 10n. The test plug 10n receives the transmitted signal on a forward channel and then returns the transmitted signal on a return. The returned signal is identical to the signal that the test plug 10n received.

The original signals may be simultaneously applied to two or more of the T1 lines. For example, the original signal may be simultaneously applied to channel one of each T1 line or the original signal may be simultaneously applied to randomly selected channels among the T1 lines.

The jack receptacle 24n associated with a particular plug 10n receives the return signal from the plug 10n and sends it through the time division multiplexer 54 with the particular signal. The return signal is sent back to the CPU 50 where it is compared with the original signal, which is stored in memory 56. If the original signal is identical to the return signal, then the particular channel of the T1 line that sent and received that signal is functional. If the original signal is different from the return signal, then a user is alerted that there is some sort of hardware problem in that particular jack receptacle.

Figure 4:
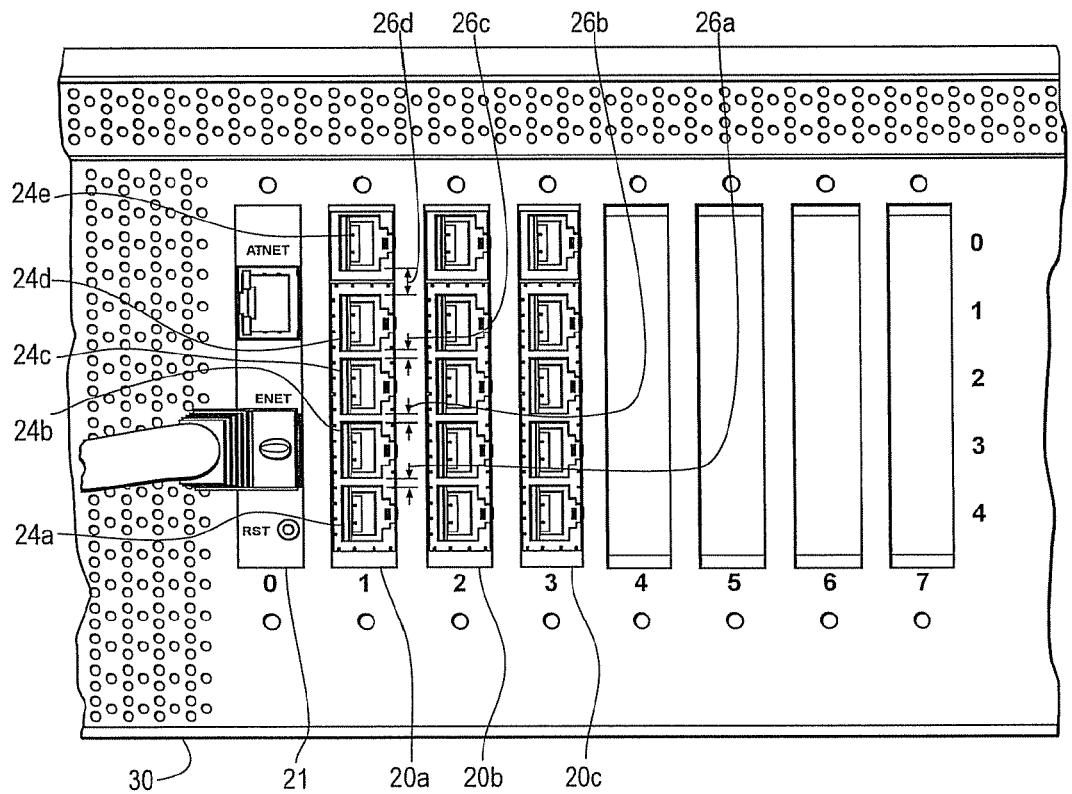
FIG. 4 is a side view of a chassis with a plurality of T1 board inserted therein.

FIG. 4 is a side view of a chassis with a plurality of T1 boards inserted therein. Up to seven T1 boards, for example 20a, 20b, 20c, and a control board 21 can be inserted into the chassis 30 at one time. The testing process described above is performed on each of the T1 boards 20a, 20b, 20c in the chassis 30.

Figure 5:
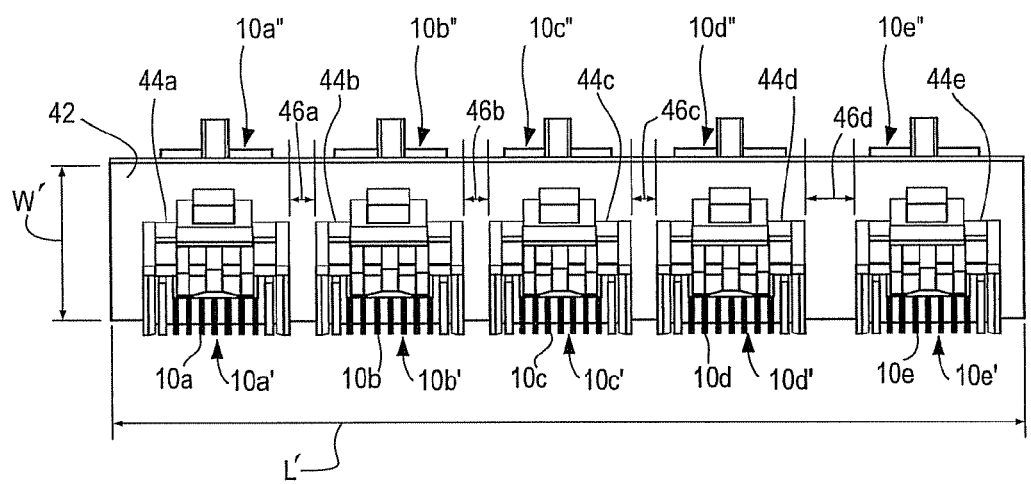
FIG. 5 is a perspective view of a test adaptor under an illustrated embodiment of the invention.

FIG. 5 is a perspective view of a test adaptor for turnaround plugs. The test adaptor 40 is formed from a bracket 42 having a length L' and a width W'. The length L' and width W' of the bracket 42 are complimentary to the length L and the width W of the end 22 of the T1 board 20. In one embodiment of the present invention, the bracket 42 is made of metal and is rigid.

The bracket 42 has a plurality of holes 44a, 44b, 44c, 44d, 44e that are disposed within the bracket 42 and that are spaced apart from each other at predetermined distances 46a, 46b, 46c, 46d. The predetermined distances 46a, 46b, 46c, 46d between the plurality of holes 44a, 44b, 44c, 44d, 44e in the bracket 42 are complimentary to the distances 26a, 26b, 26c, 26d between the plurality of jack receptacles 24a, 24b, 24c, 24d, 24e in the end 22 of the T1 board 20. A plurality of test plugs 10a, 10b, 10c, 10d, 10e are mounted within the plurality of holes 44a, 44b, 44c, 44d, 44e in the bracket 42 such that the test adaptor 40 is formed having a plurality of plugs 10a, 10b, 10c, 10d, 10e spaced apart from each other at predetermined distances 46a, 46b, 46c, 46d. As seen in FIG. 5, each plug 10a, 10b, 10c, 10d, 10e is mounted in its respective hole 44a, 44b, 44c, 44d, 44e such that the first end 10a', 10b', 10c', 10d', 10e' of each plug 10a, 10b, 10c, 10d, 10e extends past a first side of the bracket 42 and the second end 10a", 10b", 10c", 10d", 10e" extends past a second side of the bracket 42.

When the test adaptor 40 is substantially aligned with the end 22 of the T1 board 20, the plurality of plugs 10a, 10b, 10c, 10d, 10e are aligned with the plurality of jack receptacles 24a, 24b, 24c, 24d, 24e. The plurality of plugs 10a, 10b, 10c, 10d, 10e have a complimentary arrangement to the plurality of jacks 24a, 24b, 24c, 24d, 24e. Thus, the plurality of plugs 10a, 10b, 10c, 10d, 10e can be substantially simultaneously engaged with the plurality of jack receptacles 24a, 24b, 24c, 24d, 24e with a single mechanical step. When the plurality of jack receptacles 24a, 24b, 24c, 24d, 24e are engaged with the plurality of plugs 10a, 10b, 10c, 10d, 10e, the testing process described above can commence. When seven T1 boards 20 are inserted into a chassis 30, only seven insertions are required to test the plurality of jack receptacles 24a, 24b, 24c, 24d, 24e in each T1 board 20.

Similarly, after the testing process described above is complete, the plurality of plugs 10a, 10b, 10c, 10d, 10e in each test adaptor 40 can be substantially simultaneously disengaged from the plurality of jack receptacles 24a, 24b, 24c, 24d, 24e of each T1 board 20 with a single mechanical step. Thus, when seven T1 boards 20 are inserted into a chassis 30, only seven removals are required to disengage the plurality of plugs 10a, 10b, 10c, 10d, 10e from the plurality of jack receptacles 24a, 24b, 24c, 24d, 24e of each T1 board 20.

From the foregoing, it will be observed that numerous variations and modifications may be effected without departing from the spirit and scope of the invention. It is to be understood that no limitation with respect to the specific apparatus illustrated herein is intended or should be inferred. It is, of course, intended to cover by the appended claims all such modifications as fall within the scope of the claims.

What is claimed:

1. A test adaptor for performing turnaround testing on a digital signal 1 board (T1 board) having a plurality of jack receptacles disposed therein comprising:
    a bracket formed from a single, unitary structure, the bracket having a length and a width complimentary to a length and a width of an end of a T1 board;
    a plurality of holes disposed in the bracket, the plurality of holes spaced within the bracket so as to be complimentary with the plurality of jack receptacles disposed in the T1 board; and
    a plurality of test plugs mounted in respective ones of the plurality of holes in the bracket, a first end of each test plug extending past a first side of the bracket and a second end of each test plug extending past a second side of the bracket, wherein the plurality of test plugs can be engaged with the plurality of jack receptacles substantially simultaneously and with a single mechanical step, and wherein each of the test plugs is removably secured in its respective hole disposed in the bracket, the bracket remaining a single, unitary structure when any of the test plugs is mounted in or removed from the bracket.

2. The adaptor as in claim 1 wherein the bracket is rigid.

3. The adaptor as in claim 1 wherein the bracket is metal.

4. The adaptor as in claim 1 wherein the plurality of test plugs are turnaround plugs.

5. The adaptor as in claim 1 wherein the plurality of test plugs includes five plugs.

6. The adaptor as in claim 1 wherein the plugs are oriented along a linear axis of the bracket.

7. A combination of a digital signal 1 board (T1 board) and a test adaptor comprising:
    an end of the T1 board having a plurality of jack receptacles disposed therein and spaced apart from each other, the end having a length and a width;
    a bracket of the test adaptor formed from a single, unitary structure, the bracket having a length and a width complimentary to the length and the width of the end of the T1 board;
    a plurality of holes disposed in the bracket, the plurality of holes in the bracket complimentarily spaced to the plurality of jack receptacles in the end of the T1 board; and
    a plurality of test plugs mounted in respective ones of the plurality of holes in the bracket, a first end of each test plug extending past a first side of the bracket and a second ends of each test plug extending past a second side of the bracket such that the first end and second end of the test plugs are accessible when mounted in the bracket, wherein the plurality of test plugs are substantially simultaneously engaged with the plurality of jacks in a single mechanical step to test the plurality of jacks, and wherein each of the test plugs is removably secured in its respective hole disposed in the bracket, the bracket remaining a single, unitary structure when any of the test plugs is mounted in or removed from the bracket.

8. The adaptor as in claim 7 where the bracket is rigid.

9. The adaptor as in claim 7 wherein the bracket is metal.

10. The adaptor as in claim 7 wherein the plurality of plugs is turnaround plugs.

11. The adaptor as in claim 7 wherein the plurality of plugs includes five plugs.

12. The T1 board as in claim 7 wherein the T1 board is inserted into a chassis.

13. The adaptor as in claim 7 wherein the plugs are oriented along a linear axis of the bracket.

14. A method for testing a plurality of jacks in a digital signal 1 board (T1 board) comprising:
    removably mounting a plurality of plugs in respective ones of a plurality of holes, the plurality of holes disposed in a bracket formed from a single, unitary structure, the bracket remaining a single, unitary structure when any of the plugs are mounted in or removed from their respective holes, the plurality of holes spaced apart from each other, a first end of each plug extending past a first side of the bracket and a second ends of each plug extending past a second side of the bracket;
    aligning the first ends of the plurality of plugs with a plurality of jack receptacles, the plurality of jack receptacles disposed in an end of a T1 board, the plurality of jack receptacles spaced apart from each other;
    engaging the first ends of the aligned plurality of plugs with the plurality of jack receptacles substantially simultaneously and with a single mechanical step such that each plug is capable of receiving a transmit signal from the jack receptacle with which it is engaged and transmitting a return signal back to the jack receptacle, the return signal being identical to the transmit signal; and disengaging the first ends of the plurality of plugs disposed in the bracket from the plurality of jack receptacles at the end of the testing process.

15. The method as in claim 14 wherein the bracket is rigid.

16. The method as in claim 14 wherein the bracket is metal.

17. The method as in claim 14 wherein the plurality of test plugs are turnaround plugs.

18. The method as in claim 14 wherein the plurality of test plugs includes five plugs.

19. The method as in claim 14 wherein mounting a plurality of plugs further comprises mounting the plurality of plugs along a linear axis of the bracket.

\* \* \* \* \*